United States Patent
Zhang et al.

(10) Patent No.: US 12,471,370 B2
(45) Date of Patent: Nov. 11, 2025

(54) ARRAY SUBSTRATE, METHOD FOR MANUFACTURING ARRAY SUBSTRATE AND DISPLAY DEVICE

(71) Applicants: Hefei Xinsheng Optoelectronics Technology Co., Ltd., Anhui (CN); BOE TECHNOLOGY GROUP CO., LTD., Beijing (CN)

(72) Inventors: Xinxiu Zhang, Beijing (CN); Huayu Sang, Beijing (CN); Xue Zhao, Beijing (CN); Xiaodong Xie, Beijing (CN); Tengfei Zhong, Beijing (CN); Wenjie Xu, Beijing (CN); Min He, Beijing (CN); Bin Pang, Beijing (CN); Qiang Ji, Beijing (CN); Jin Zhang, Beijing (CN)

(73) Assignees: HEFEI XINSHENG OPTOELECTRONICS TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 43 days.

(21) Appl. No.: 17/639,316

(22) PCT Filed: Apr. 16, 2021

(86) PCT No.: PCT/CN2021/087866
§ 371 (c)(1),
(2) Date: Feb. 28, 2022

(87) PCT Pub. No.: WO2022/217599
PCT Pub. Date: Oct. 20, 2022

(65) Prior Publication Data
US 2024/0047481 A1 Feb. 8, 2024

(51) Int. Cl.
*H10D 86/60* (2025.01)
*H01L 25/075* (2006.01)
(Continued)

(52) U.S. Cl.
CPC ......... *H10D 86/60* (2025.01); *H01L 25/0753* (2013.01); *H01L 25/167* (2013.01);
(Continued)

(58) Field of Classification Search
CPC .... H10D 86/60; H10D 86/443; H10H 20/857; H10H 20/0364; H01L 25/0753; H01L 25/167
(Continued)

(56) References Cited

U.S. PATENT DOCUMENTS

| 7,042,024 B2 | 5/2006 | Yamazaki et al. |
| 7,053,972 B2 | 5/2006 | Lim |

(Continued)

FOREIGN PATENT DOCUMENTS

| CN | 1429055 A | 7/2003 |
| CN | 102473369 A | 5/2012 |

(Continued)

OTHER PUBLICATIONS

Written Opinion from PCT/CN2021/087866 dated Jan. 20, 2022.

*Primary Examiner* — Igwe U Anya
(74) *Attorney, Agent, or Firm* — Calfee, Halter & Griswold LLP

(57) ABSTRACT

An array substrate includes: a substrate, a first conductive layer, a second conductive layer and at least two organic insulating layers; the first conductive layer is provided on a side of the substrate; the second conductive layer is provided on a side of the first conductive layer away from the substrate, and an orthographic projection of the second conductive layer on the substrate has an overlapped region (Continued)

with an orthographic projection of the first conductive layer on the substrate, the overlapped region includes a via region and a routing region; the at least two organic insulating layers are provided between the first conductive layer and the second conductive layer, and an orthographic projection of the at least two organic insulating layers on the substrate is overlapped with an orthographic projection of the routing region.

18 Claims, 6 Drawing Sheets

(51) Int. Cl.
  *H01L 25/16* (2023.01)
  *H10D 86/40* (2025.01)
  *H10H 20/01* (2025.01)
  *H10H 20/857* (2025.01)
(52) U.S. Cl.
  CPC ........ *H10D 86/443* (2025.01); *H10H 20/857* (2025.01); *H10H 20/0364* (2025.01)
(58) Field of Classification Search
  USPC .......................................................... 257/59
  See application file for complete search history.

(56) References Cited

U.S. PATENT DOCUMENTS

| | | | |
|---|---|---|---|
| 7,442,963 B2 | 10/2008 | Yamazaki et al. | |
| 7,522,225 B2 | 4/2009 | Lim | |
| 7,709,846 B2 | 5/2010 | Yamazaki et al. | |
| 7,939,835 B2 | 5/2011 | Yamazaki et al. | |
| 8,174,029 B2 | 5/2012 | Yamazaki et al. | |
| 8,779,296 B2 | 7/2014 | Katsui et al. | |
| 8,787,949 B2 | 7/2014 | Yamazaki et al. | |
| 9,563,117 B2 | 2/2017 | Hung | |
| 9,748,436 B2 | 8/2017 | Yamazaki et al. | |
| 10,396,236 B2 | 8/2019 | Yamazaki et al. | |
| 10,516,010 B2 | 12/2019 | Yamazaki et al. | |
| 10,969,687 B2 | 4/2021 | Wang et al. | |
| 2003/0089991 A1 | 5/2003 | Yamazaki et al. | |
| 2005/0041191 A1 | 2/2005 | Lim | |
| 2006/0006424 A1 | 1/2006 | Yamazaki et al. | |
| 2006/0125996 A1 | 6/2006 | Lim | |
| 2009/0256467 A1 | 10/2009 | Yamazaki et al. | |
| 2010/0201662 A1 | 8/2010 | Yamazaki et al. | |
| 2011/0127524 A1* | 6/2011 | Yamazaki | H10D 86/423 257/43 |
| 2011/0180801 A1 | 7/2011 | Yamazaki et al. | |
| 2012/0120616 A1 | 5/2012 | Katsui et al. | |
| 2012/0228643 A1 | 9/2012 | Yamazaki et al. | |
| 2013/0248854 A1 | 9/2013 | Yamazaki et al. | |
| 2015/0008439 A1 | 1/2015 | Yamazaki et al. | |
| 2016/0299418 A1 | 10/2016 | Hung | |
| 2017/0352777 A1 | 12/2017 | Yamazaki et al. | |
| 2019/0109259 A1 | 4/2019 | Yamazaki et al. | |
| 2019/0157499 A1 | 5/2019 | Yamazaki et al. | |
| 2019/0187562 A1 | 6/2019 | Wang et al. | |
| 2020/0142561 A1* | 5/2020 | Lu | G06F 3/04144 |
| 2021/0043714 A1 | 2/2021 | Wang et al. | |

FOREIGN PATENT DOCUMENTS

| | | |
|---|---|---|
| CN | 102640292 A | 8/2012 |
| CN | 104465652 A | 3/2015 |
| CN | 106154757 A | 11/2016 |
| CN | 104465652 B | 9/2018 |
| CN | 109742091 A | 5/2019 |
| CN | 109935515 A | 6/2019 |
| CN | 111524910 A | 8/2020 |
| CN | 111952323 A | 11/2020 |
| CN | 112056005 A | 12/2020 |
| CN | 112505964 A | 3/2021 |
| EP | 2461309 A1 | 6/2012 |
| WO | 2011/065208 A1 | 6/2011 |
| WO | 2019/215863 A1 | 11/2019 |

* cited by examiner ated Apr. 16, # ARRAY SUBSTRATE, METHOD FOR MANUFACTURING ARRAY SUBSTRATE AND DISPLAY DEVICE

CROSS-REFERENCE TO RELATED APPLICATION

This application is the U.S. national phase application of PCT Application No. PCT/CN2021/087866, filed Apr. 16, 2021, the entire content of which is incorporated herein by reference.

TECHNICAL FIELD

The present disclosure relates to the field of display technology, and in particular to an array substrate, a method for manufacturing the array substrate, and a display device.

BACKGROUND

Mini-LED is a new LED display technology derived from small pitch LED, and is also known as a sub-millimeter light-emitting diode. It has a grain size about 100 μm to 200 μm, that is, between traditional LED and Micro LED. Due to its good display effect, thin and light experience, as well as the advantages of high contrast ratio, long service life and the like, Mini-LED has an obvious trend of use in the field of high-end display.

It should be noted that the information disclosed in the above background section is only for enhancing the understanding of the background of the present disclosure, therefore it may include information that does not constitute the prior art known to those skilled in the art.

SUMMARY

The present disclosure is directed to overcome the above-mentioned shortcomings of the prior art, and to provide an array substrate, a method for manufacturing the array substrate and a display device.

An aspect of the present disclosure provides an array substrate, including:
  a substrate;
  a first conductive layer, provided on a side of the substrate;
  a second conductive layer, provided on a side of the first conductive layer away from the substrate, wherein an orthographic projection of the second conductive layer on the substrate has an overlapped region with an orthographic projection of the first conductive layer on the substrate, and the overlapped region includes a via region and a routing region; and
  at least two organic insulating layers, provided between the first conductive layer and the second conductive layer, and an orthographic projection of the at least two organic insulating layers on the substrate is overlapped with an orthographic projection of the routing region.

In some embodiments of the present disclosure, the at least two organic insulating layers include:
  a first organic insulating layer, provided on the side of the first conductive layer away from the substrate; and
  a second organic insulating layer, provided on a side of the first organic insulating layer away from the substrate, wherein an orthographic projection of the second organic insulating layer on the substrate is located within the orthographic projection of the routing region.

In some embodiments of the present disclosure, the at least two organic insulating layers include:
  a first organic insulating layer, provided on the side of the first conductive layer away from the substrate; and
  a second organic insulating layer, provided on a side of the first organic insulating layer away from the substrate, wherein the second organic insulating layer is provided as a whole layer.

In some embodiments of the present disclosure, the orthographic projection of the second organic insulating layer on the substrate is located within an orthographic projection of the first organic insulating layer on the substrate.

In some embodiments of the present disclosure, the array substrate further includes:
  a first inorganic insulating layer, provided between the first conductive layer and the first organic insulating layer.

In some embodiments of the present disclosure, the array substrate further includes:
  a second inorganic insulating layer, provided between the first organic insulating layer and the second organic insulating layer.

In some embodiments of the present disclosure, the first conductive layer includes a bonding portion, and an orthographic projection of the bonding portion on the substrate is overlapped with an orthographic projection of only one of the at least two organic insulating layers on the substrate.

In some embodiments of the present disclosure, the first conductive layer includes a bonding portion, an orthographic projection of the bonding portion on the substrate is overlapped with the orthographic projection of the first organic insulating layer on the substrate, and the orthographic projection of the bonding portion on the substrate is not overlapped with the orthographic projection of the second organic insulating layer on the substrate.

In some embodiments of the present disclosure, the at least two organic insulating layers have different thicknesses.

In some embodiments of the present disclosure, a thickness of the first organic insulating layer is less than that of the second organic insulating layer.

In some embodiments of the present disclosure, the first conductive layer includes a plurality of conductive portions, the second conductive layer includes a plurality of pads, and an orthographic projection of at least a part of the pads on the substrate is not overlapped with an orthographic projection of the conductive portions on the substrate.

Another aspect of the present disclosure provides a method for manufacturing an array substrate, the manufacturing method including:
  provide a substrate;
  forming a first conductive layer on a side of the substrate;
  forming at least two organic insulating layers on a side of the first conductive layer away from the substrate; and
  forming a second conductive layer on a side of the at least two organic insulating layers away from the substrate, where an orthographic projection of the second conductive layer on the substrate has a overlapped region with an orthographic projection of the first conductive layer on the substrate, the overlapped region includes a via region and a routing region; and an orthographic projection of the at least two organic insulating layers on the substrate is overlapped with an orthographic projection of the routing region.

In some embodiments of the present disclosure, where forming the at least two organic insulating layers on the side of the first conductive layer away from the substrate includes:

forming a first organic insulating layer on the side of the first conductive layer away from the substrate;

forming a second organic insulating material layer on a side of the first organic insulating layer away from the substrate; and forming a second organic insulating layer by patterning the second organic insulating material layer though a first mask used for forming the first conductive layer and a second mask used for forming the second conductive layer.

In some embodiments of the present disclosure, where forming the at least two organic insulating layers on the side of the first conductive layer away from the substrate includes: forming a first organic insulating layer on the side of the first conductive layer away from the substrate; and forming, on a side of the first organic insulating layer away from the substrate, a second organic insulating layer provided as a whole layer.

In some embodiments of the present disclosure, where after forming the first conductive layer on a side of the substrate, and before forming the first organic insulating layer on the side of the first conductive layer away from the substrate, the manufacturing method further includes:

forming a first inorganic insulating material layer on the side of the first conductive layer away from the substrate;

forming a first organic insulating layer on a side of the first inorganic insulating material layer away from the substrate; and forming a first inorganic insulating layer by patterning the first inorganic insulating material layer with the first organic insulating layer serving as a mask.

In some embodiments of the present disclosure, where after forming the first organic insulating layer on the side of the first conductive layer away from the substrate, and before forming, on the side of the first organic insulating layer away from the substrate, the second organic insulating layer provided as a whole layer, the manufacturing method further includes:

forming a second inorganic insulating material layer on the side of the first organic insulating layer away from the substrate;

forming the second organic insulating layer on a side of the second inorganic insulating material layer away from the substrate; and forming a second inorganic insulating layer by patterning the second inorganic insulating material layer with the second organic insulating layer serving as a mask.

Still another aspect of the present disclosure provides a display device, including the array substrate provided by the above-mentioned embodiments.

The array substrate provided by the present disclosure has at least two organic insulating layers between the first conductive layer and the second conductive layer. On one hand, provision of the at least two organic insulating layers increases a distance between the first conductive layer and the first conductive portion, thereby reducing the potential difference between the first conductive layer and the second conductive layer. On the other hand, by providing the at least two organic insulating layers, it may effectively avoid the growth of copper material in the first conductive layer and the second conductive layer, and may avoid the problem of lightening defect of LED lamp beads due to the impurity particles between the first conductive layer and the second conductive layer which causes a short circuit therebetween, thereby reducing the DGS (data gate short) defect.

It should be understood that the above general description and the following detailed description are only exemplary and explanatory and do not limit the present disclosure.

BRIEF DESCRIPTION OF THE DRAWINGS

The accompanying drawings herein are incorporated into the specification and constitute a part of it, illustrating embodiments consistent with the present disclosure, and serving to explain the principles of the present disclosure together with the specification. It is obvious that the drawings in the following description are only some embodiments of the present disclosure, and for those skilled in the art, other drawings may also be obtained from these drawings without creative labor.

DETAILED DESCRIPTION

Figure 1:
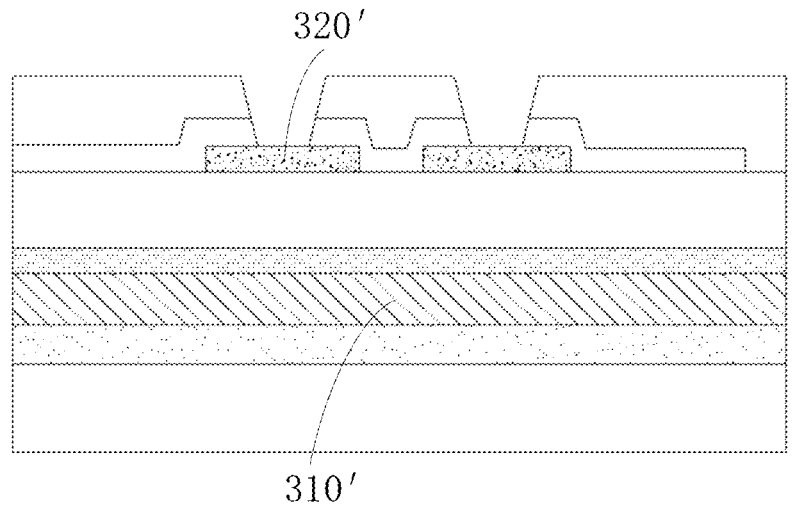
FIG. 1 is a schematic diagram of a cross-sectional structure of an array substrate in the related art.

Example embodiments will now be described more fully with reference to the accompanying drawings. Example embodiments, however, may be embodied in various forms and should not be construed as limited to the embodiments set forth herein; rather, these embodiments are provided so that the disclosure will be thorough and complete, and will fully convey the concept of example embodiments to those skilled in the art. The same reference numerals in the drawings denote the same or similar structures, and thus their detailed description will be omitted. Furthermore, the drawings are merely schematic illustrations of the present disclosure, and are not necessarily drawn to scale.

In the drawings, the thickness of regions and layers may be exaggerated for clarity. The same reference numerals in the drawings denote the same or similar structures, and thus their detailed description will be omitted.

The described features, structures or characteristics may be combined in one or more embodiments in any suitable manner. In the following description, numerous specific details are provided in order to give a thorough understanding of the embodiments of the present disclosure. However, those skilled in the art will appreciate that the technical solutions of the present disclosure may be practiced without one or more of the specific details, or other methods, components, materials, etc. may be employed. In other cases, well-known structures, materials, or operations are not shown or described in detail to avoid the obscuration of the main technical idea of the present disclosure.

When a structure is "on" another structure, it may mean that the structure is integrally formed on the another structure, or that the structure is "directly" provided on the another structure, or that the structure is "indirectly" provided on the another structure through yet another structure.

The terms "one", "a/an", "the/said" are configured to indicate the presence of one or more elements/components/and the like; and the terms "comprise/include" and "have/has" are configured to indicate an open inclusion and mean that there may be additional elements/components/and the like in addition to the listed elements/components/and the like. Although the terms "first", "second" and the like may be used herein to describe various regions, layers and/or portions, these regions, layers and/or portions should not be limited by these terms. Rather, these terms are merely used to distinguish one region, layer and/or portion from another. In the present disclosure, when describing "overlap" between two structures, it means that the orthographic projection of one of the structures on the substrate is at least partially overlapped with the orthographic projection of the other structure on the substrate.

In the related technology of Mini LED, as shown in FIG. 1, copper metal layer 310' and copper metal layer 320' are prepared by using two different masks, and are separated by an insulating layer. However, due to the limitations of substrate size, process and the like, when the copper metal layer 320' located on the upper layer is prepared, it is often inevitable to overlap with the copper metal layer 310' below. The overlapped region of these two layers is a region with weak performance, which is prone to occur a short circuit or open circuit, resulting in defects or affecting reliability.

For example, if a pad of the upper copper metal layer 320' is overlapped with a signal line of the lower copper metal layer 310', then during subsequent welding of functional elements, for example when LED chips are weld by adopting SMT reflow welding technology, since the temperature in the welding section reaches 260° C.~265° C. which is easy to exceed a temperature resistance value of the middle insulating layer, thereby resulting in the damage of OC glue at the pad, which in turn results in a short circuit between the pad and the signal line. In addition, during the die-bonding of LED chips, the sharp angled particles of the LED may also stab and break the pad and the insulating layer, thereby resulting in a short circuit between the pad and the signal line.

For another example, if a lead of the upper copper metal layer 320' is overlapped with the signal line of the lower copper metal layer 310', then the air-type static electricity generated at an edge of the overlap region is likely to break down the insulating layer, thereby resulting in a short circuit between the lead and the signal line. In addition, the particles generated in the process cannot be completely eliminated, and when the particles fall in the overlapped region between the lead and the signal line, it is easy to cause unstable conduction between the lead and the signal line, thereby affecting the reliability of the product. In addition, when the upper-layer lead is tested for current or voltage by adopting the needle test method, it is possible to pierce the insulating layer and stab the signal line below, thereby resulting in the inaccurate testing or reduced accuracy.

One reason for the short circuit between the copper metal layer 310' and the copper metal layer 320' is that the signal line of the lower copper metal layer 310' is usually provided to be relatively thick and wide to provide a high voltage/current and a low resistance, and the lead of the upper copper metal layer 320' is usually provided to be relatively narrow and short, serving as a structure such as a wire, a pad and the like. Therefore, there is a certain potential difference between these two layers. Since, during the glass based film manufacturing process, the insulating layer between the two conductive portions is in a semi-solid and semi-liquid state before curing, the water vapor introduced during the process may remain in the insulating layer. However, the essence of copper growth is the electrochemical corrosion, and in the presence of the potential difference, the water is easy to trigger an electrochemical reaction forming OH in the insulating layer, which may cause a short circuit between the lead of the upper copper metal layer 320' and the signal line of the lower copper metal layer 310'.

It may be seen that in order to ensure the product quality and performance, the short circuit between the copper metal layer 310' and the copper metal layer 320' should be avoided as far as possible.

Figure 6:
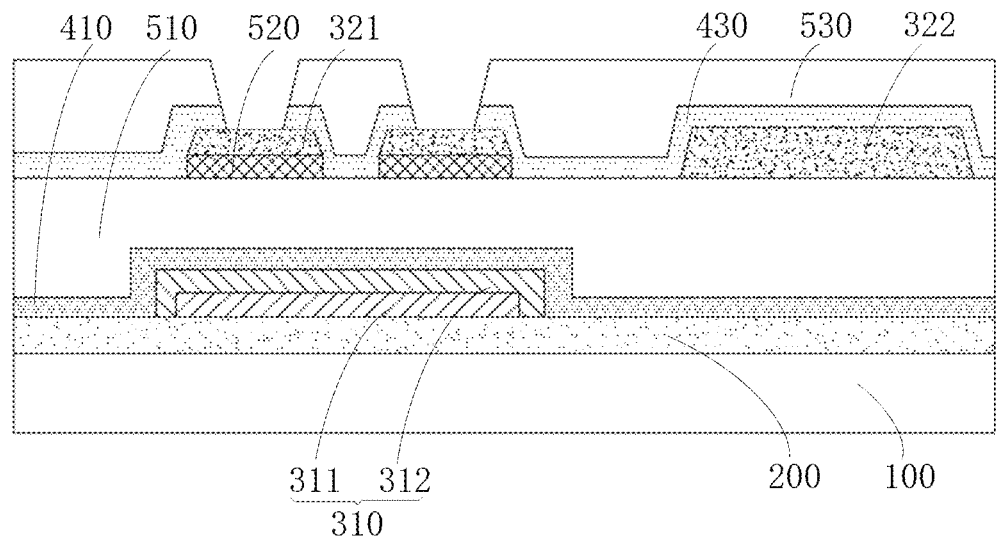
Figure 9:
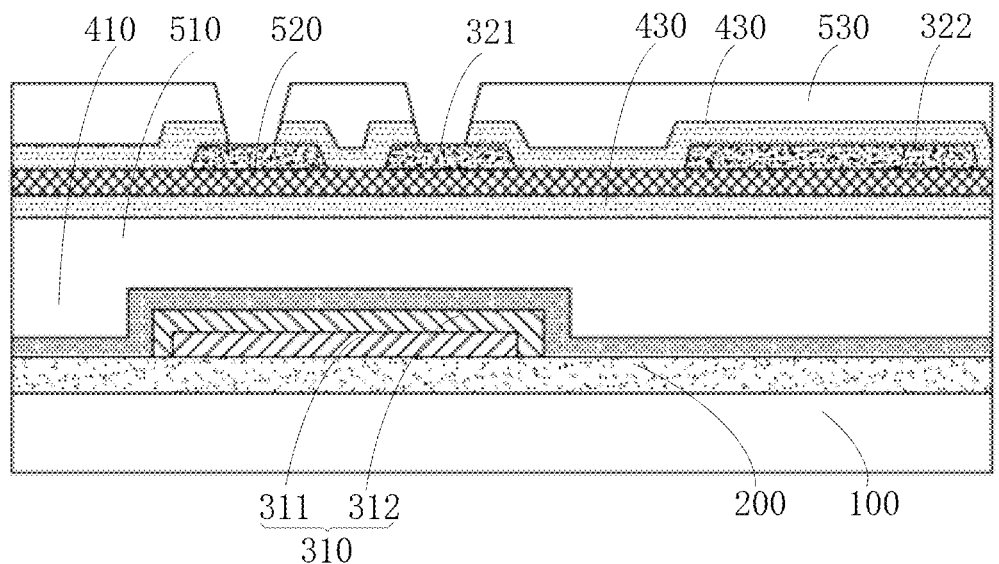

In view of the above technical problems, the present disclosure provides an array substrate, as shown in FIG. 6 and FIG. 9, the array substrate includes a substrate 100, a first conductive layer 310, a second conductive layer 320 and at least two organic insulating layers. The first conductive layer 310 is provided on a side of the substrate 100; the second conductive layer 320 is provided on a side of the first conductive layer 310 away from the substrate 100, an orthographic projection of the second conductive layer 320 on the substrate 100 has an overlapped region with an orthographic projection of the first conductive layer 310 on the substrate 100, and the overlapped region includes a via region and a routing region. The at least two organic insulating layers are provided between the first conductive layer 310 and the second conductive layer 320, and an orthographic projection of the at least two organic insulating layers on the substrate 100 is overlapped with an orthographic projection of the routing region. The routing region may be a region other than the via region.

In the array substrate according to the present disclosure, there are at least two organic insulating layers between the first conductive layer and the second conductive layer. On one hand, provision of the at least two organic insulating layers increases a distance between the first conductive layer and the first conductive portion, thereby reducing the potential difference between the first conductive layer and the second conductive layer. On the other hand, by providing the at least two organic insulating layers, it may effectively avoid the growth of copper material in the first conductive layer and the second conductive layer, and may avoid the problem of flashing defect of LED lamp beads due to the impurity particles between the first conductive layer and the second conductive layer which causes a short circuit between the first conductive layer and the second conductive layer, thereby reducing the DGS (short circuit between a gate line and a data line) defect.

The first conductive layer 310 is generally configured to arrange various signal lines, that is, the first conductive layer 310 may be formed with various signal lines, such as a common voltage line GND, a driving voltage line VLED, a source power line PWR, a source address line DI, and the like. Optionally, the thickness of the film layer is about 1.5 μm to 7 μm. The material of the first conductive layer 310 includes copper, for example, a laminated material such as MoNb/Cu/MoNb may be formed by sputtering, where a bottom layer MoNb (300 Å) is configured to improve adhesion, an intermediate layer Cu is configured to transmit electrical signals, and a top layer MoNb (200 Å) is configured to prevent oxidation. The first conductive layer 310 may be formed by electroplating, where a seed layer MoNiTi is first formed to improve the grain nucleation density, and then an anti-oxidation layer MoNiTi is prepared after electroplating. The first conductive layer 310 may be formed of two conductive layers including a first sub conductive layer 311 and a second sub conductive layer 312.

The second conductive layer 320 is generally configured to arrange various pads, such as a pad for installing a functional element or a pad for installing a driving chip of the functional element. The second conductive layer 320 may also be formed with a lead which has a connection function, that is, the first conductive portion 321 may also be a lead. Optionally, a thickness of this film layer is about 6000 Å, and its material may be, for example, a laminated material such as MoNb/Cu/CuNi, where the bottom layer MoNb is configured to improve adhesion, the intermediate layer Cu is configured to transmit electrical signals, and the top layer CuNi may be configured for both oxidation protection and die-bonding fastness.

Figure 11:
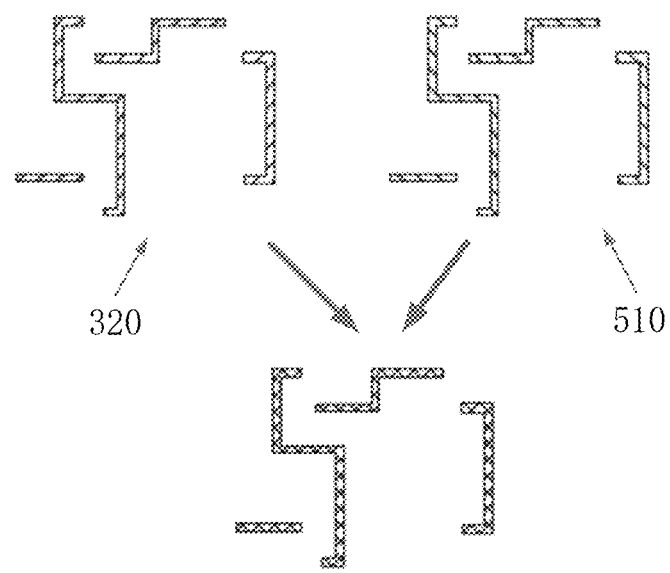
FIG. 11 is a schematic diagram of patterns of the first conductive layer and the second organic insulating layer according to some embodiments of the present disclosure.
Figure 12:
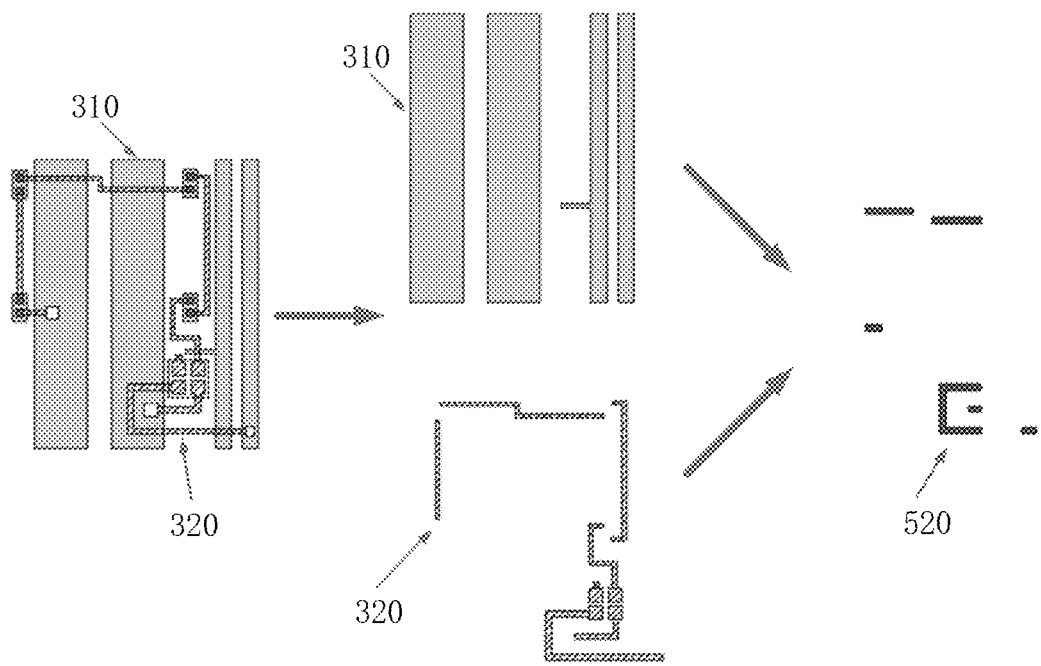
FIG. 12 is a schematic diagram of forming a second organic insulating layer through masks of the first conductive layer and the second conductive layer according to some embodiments of the present disclosure.

In some embodiments of the present disclosure, as shown in FIG. 6, FIG. 11 and FIG. 12, the at least two organic insulating layers include: a first organic insulating layer 510 and a second organic insulating layer 520. The first organic insulating layer is provided on a side of the first conductive layer 310 away from the substrate 100. The second organic insulating layer 520 is provided on a side of the first organic insulating layer 510 away from the substrate 100, and an orthographic projection of the second organic insulating layer 520 on the substrate 100 is located within the orthographic projection of the routing region. In other words, the first organic insulating layer 510 may be provided as a whole layer, and the second organic insulating layer 520 is only formed in the overlapped region of the first conductive layer 310 and the second conductive layer 320.

In some embodiments of the present disclosure, as shown in FIG. 11 and FIG. 12, the overlapped region of the first conductive layer 310 and the second conductive layer 320 except for the via region has a same pattern with a pattern of the second organic insulating layer 520. In other words, a position where the second organic insulating layer 520 is provided as a spacer includes the overlapped region of the second conductive layer 320 and the first conductive layer 310 except for the via region, since the second organic insulating layer 520 only needs to be prepared at the bottom of the second conductive layer 320. Therefore, the mask of the second conductive layer 320 may be used to form the second organic insulating layer 520, thereby saving the cost of one mask.

In some other embodiments of the present disclosure, as shown in FIG. 9, the at least two organic insulating layers include: a first organic insulating layer 510 and a second organic insulating layer 520. The first organic insulating layer 510 is provided on the side of the first conductive layer 310 away from the substrate 100. The second organic insulating layer 520 is provided on the side of the first organic insulating layer 510 away from the substrate 100, and the second organic insulating layer 520 is provided as a whole layer. In other words, both the first organic insulating layer 510 and the second organic insulating layer 520 may be provided as whole layers. The terms "provided as a whole layer" herein are used for describing a layer is formed into such a manner that an orthographic projection of the layer covers the whole substrate. However, it should be noted that the whole layer structure is not limited to a fully complete structure, and may also include a structure such as a via depending on the functional requirements. Moreover, the whole layer structure is also not limited to fully covering a lower structure. For example, the whole layer structure may be obtained by forming a whole layer of material on a target region of the lower structure, and then partially patterning the whole layer of material as required.

The second organic insulating layer 520 is provided as a whole layer, and the orthographic projection of the second organic insulating layer 520 on the substrate 100 is located within, or completely overlapped with the orthographic projection of the first organic insulating layer 510 on the substrate 100. The orthographic projection of the portion of the second conductive layer 320, other than the via portion connected with the first conductive layer 310, on the substrate 100 may be located within the orthographic projection of the second organic insulating layer 520 on the substrate 100.

In the array substrate provided by the present disclosure, the first organic insulating layer 510 and the second organic insulating layer 520 together constitute an insulating medium layer between the first conductive portion 321 and the first conductive layer 310. Compared with the array substrate of the related art as shown in FIG. 1, the second organic insulating layer 520 is formed under the overlapped region of the second conductive layer 320 and the first conductive layer 310. Accordingly, on one hand, a distance of the overlapped region of the first conductive layer 310 and the second conductive layer 320 is increased, thereby reducing the potential difference between the first conductive layer 310 and the second conductive layer 320. On the other hand, by providing the second organic insulating layer 520, it may effectively avoid the growth of copper material in the first conductive layer 310 and the second conductive layer 320, and may avoid the problem of the lightening defect of LED lamp beads due to the impurity particles between the first conductive layer 310 and the second conductive layer 320 which causes a poor short circuit therebetween, thereby reducing the DGS defect.

In some embodiments, the orthographic projection of the second organic insulating layer 520 on the substrate 100 is located within the orthographic projection of the first organic insulating layer 510 on the substrate 100. In other words, when the orthographic projection of the second organic insulating layer 520 on the substrate 100 is located within the orthographic projection of the routing region, or when the second organic insulating layer 520 is provided as a whole layer, the orthographic projection of the second organic insulating layer 520 on the substrate 100 is located within the orthographic projection of the first organic insulating layer 510 on the substrate 100.

In some embodiments of the present disclosure, as shown in FIG. 6 and FIG. 9, the array substrate further includes: a first inorganic insulating layer 410 provided between the first conductive layer 310 and the first organic insulating layer 510. The first inorganic insulating layer 410 is provided as a whole layer, thereby increasing the distance of the overlapped region of the first conductive layer 310 and the second conductive layer 320, reducing the electric field strength of the electrochemical corrosion, and blocking the movement of ions.

In some embodiments of the present disclosure, as shown in FIG. 9, the array substrate further includes: a second inorganic insulating layer 420 provided between the first organic insulating layer 510 and the second organic insulating layer 520. The second inorganic insulating layer 420 is provided as a whole layer, so that the first inorganic insulating layer 410 and the second inorganic insulating layer 420 form a double-layer water barrier, thereby further increasing the distance of the overlapped region of the first conductive layer 310 and the second conductive layer 320, reducing the electric field strength of the electrochemical corrosion, and blocking the movement of ions.

In some embodiments of the present disclosure, the first conductive layer 310 includes a bonding portion, and an orthographic projection of the bonding portion on the substrate 100 is overlapped with the orthographic projection of only one organic insulating layer of the at least two organic insulating layers on the substrate 100.

For example, the first conductive layer 310 includes a bonding portion, the orthographic projection of the bonding portion on the substrate 100 is overlapped with the orthographic projection of the first organic insulating layer 510 on the substrate 100, and the orthographic projection of the bonding portion on the substrate 100 is not overlapped with the orthographic projection of the second organic insulating layer 520 on the substrate 100.

The second organic insulating layer 520 prepared by a mask is only opened with small holes in the bonding region and at a lap joint of the first conductive layer 310 and the second conductive layer 320. Due to the segment difference of the opening in the bonding region, the smaller the segment difference is, the better it is for the conductive particle lamination process. The first inorganic insulating layer 410 may be dry-etched by adopting a mask of the organic insulating layer, so as to achieve the purpose of water isolation. Then, a whole layer of inorganic insulating layer material is sputtered (sputtering coated). Next, the mask of the organic insulating layer is adopted with a baffle design, and during the patterning process, the second organic insulating layer 520 may be, for example, a negative photoresist, the second organic insulating layer 520 which does not cover the bonding region may be formed by pushing the baffle over the bonding region for shielding. Subsequently, the second inorganic insulating layer 420, which does not cover the bonding region, is dry-etched by adopting the mask of the organic insulating layer. In this way, a single mask is used to achieve the dual effects of thickening the organic insulating layer and thinning the bonding region, and also achieve a desirable insulating "sandwich" structure: the first inorganic insulating layer, the first organic insulating layer, and the second inorganic insulating layer. Such design, on one hand, reduces the electric field strength of electrochemical corrosion by increasing the in-plane thickness of the insulating layer, and on the other hand achieves the structural design of the double-layer water barrier, which destroys the anodic reaction and blocks the movement of ions.

In some embodiments of the present disclosure, the at least two organic insulating layers have different thicknesses. For example, the thickness of the first organic insulating layer 510 is less than the thickness of the second organic insulating layer 520. The thickness of the first organic insulating layer 510 may be, for example, 1.5 µm to 2.5 µm, such as 1.5 µm, 1.8 µm, 2.0 µm, 2.2 µm, 2.5 µm, and the like, which are not enumerated in the present disclosure. The thickness of the second organic insulating layer 520 may be, for example, 3.5 µm to 4.5 µm, such as 3.5 µm, 3.8 µm, 4.0 µm, 4.2 µm, 4.5 µm, and the like, which are not enumerated in the present disclosure. For another example, the thickness of the first organic insulating layer 510 may also be less than 1.5 µm or greater than 2.5 µm, and the thickness of the second organic insulating layer 520 may also be less than 3.5 µm or greater than 4.5 µm, which is not limited in the present disclosure, as long as the thickness of the first organic insulating layer 510 is less than the thickness of the second organic insulating layer 520.

In some embodiments of the present disclosure, as shown in FIG. 6 and FIG. 9, the array substrate further includes: a buffer layer 200. The buffer layer 200 is provided between the substrate 100 and the first inorganic insulating layer 410. The material of the buffer layer 200 may be an insulating material such as silicon oxide, silicon nitride, which is not particularly limited herein. The buffer layer 200 may be formed by chemical vapor deposition or other processes, and the process for forming the buffer layer is not particularly limited herein.

The material of the substrate 100 may be an inorganic material, which may be for example, a glass material such as soda lime glass, quartz glass, sapphire glass, or various metal materials such as stainless steel, aluminum, and nickel, or their alloys. In some other embodiments, the material of the substrate 100 may also be an organic material, which may be for example, polymethyl methacrylate, polyvinyl alcohol, polyvinyl phenol, polyethersulfone, polycarbonate, polyethylene terephthalate, polyethylene naphthalate, or a combination thereof. In some other embodiments, the material of the substrate 100 may also be a flexible material, for example polyimide.

The materials of the first inorganic insulating layer 410 and the second inorganic insulating layer 420 may be silicon oxide, silicon oxynitride, silicon nitride or other suitable inorganic insulating substances (such as organic polymer compound) or a combination of the above materials. The method for forming the first inorganic insulating layer 410 is, for example, sputtering, physical vapor deposition, chemical vapor deposition, spin coating, or a combination thereof. The materials of the first inorganic insulating layer 410 and the second inorganic insulating layer 420 may be the same or different.

The materials of the first organic insulating layer 510 and the second organic insulating layer 520 may be OC glue or other suitable organic insulating substances. The method for forming the first organic insulating layer 510 and the second organic insulating layer 520 is, for example, physical vapor deposition, chemical vapor deposition, spin coating, or a combination thereof. The materials of the second organic insulating layer 520 and the first organic insulating layer 510 may be the same, for example, both are formed by OC glue.

Figure 10:
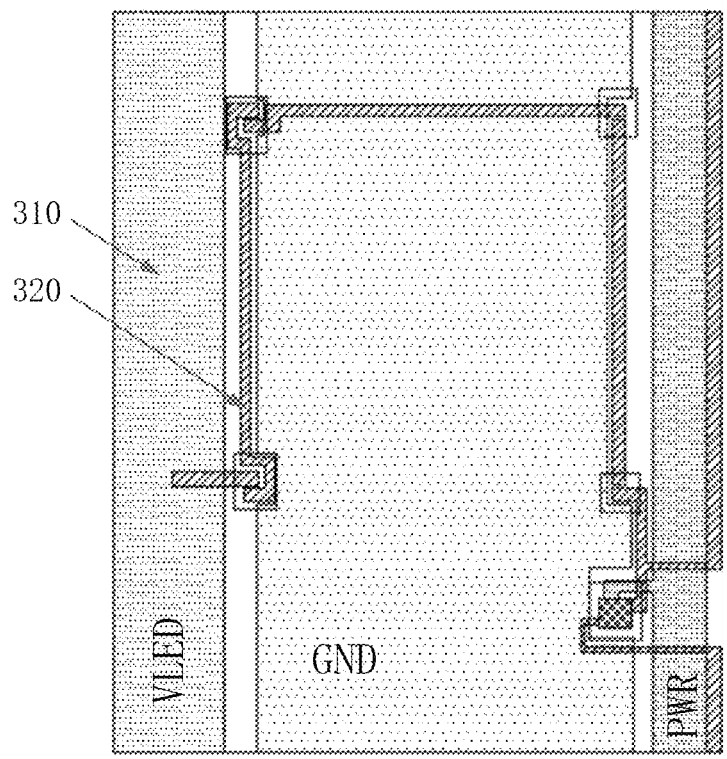
FIG. 10 is a schematic diagram of the overlapped routing between a first conductive layer and a second conductive layer according to some embodiments of the present disclosure.

As shown in FIG. 10, the first conductive layer 310 includes a plurality of conductive portions including a common voltage line GND, a driving voltage line VLED, a source power line PWR, a source address line DI, and the like. The second conductive layer 320 includes a plurality of pads, and the orthographic projections of at least a part of the pads on the substrate 100 are at least partially located within gaps between the orthographic projections of the plurality of conductive portions on the substrate 100. In other words, the orthographic projections of at least a part of the pads on the substrate 100 are not overlapped with the orthographic projections of the conductive portions on the substrate 100. By forming the pads in the gaps between the conductive portions, there is no need to provide the second organic insulating layer 520 under the pads, therefore it may avoid the adverse effect of the thickening of the pads which is caused by the provision of the second organic insulating layer 520 when the pads are overlapped with the first conductive layer 310.

In some embodiments of the present disclosure, as shown in FIG. 6 and FIG. 9, the array substrate further includes: a third inorganic insulating layer 430 and a third organic insulating layer 530. The third inorganic insulating layer 430 is provided on the side of the second organic insulating layer 520 away from the substrate 100, and covers the second organic insulating layer 520 and the second conductive layer 320. The third organic insulating layer 530 is provided on a side of the third inorganic insulating layer 430 away from the substrate 100. Via holes may be formed in the third inorganic insulating layer 430 and the third organic insulating layer 530 though processes such as etching, so as to expose the second conductive layer 320.

The material of the third inorganic insulating layer 430 may be silicon oxide, silicon oxynitride, silicon nitride, or other suitable insulating substances (for example, organic polymer compound) or a combination of the above materials. The method for forming the first inorganic insulating layer 410 is, for example, sputtering, physical vapor deposition, chemical vapor deposition, spin coating, or a combination thereof. The material of the third inorganic insulating layer 430 may be same as or different from that of the first inorganic insulating layer 410 or the second inorganic insulating layer 420.

The material of the third organic insulating layer 530 may be OC glue or other suitable insulating substances. The method for forming the third insulating layer 530 is, for example, physical vapor deposition, chemical vapor deposition, spin coating, or a combination thereof. The material of the third organic insulating layer 530 may be same as or different from that of the second organic insulating layer 520 or the first organic insulating layer 510, for example, all are formed by OC glue.

The following method embodiments are provided by the present disclosure, and for details that are not disclosed in the method embodiments, the above-mentioned device embodiments may be referred to, which will not be elaborated herein.

Figure 2:
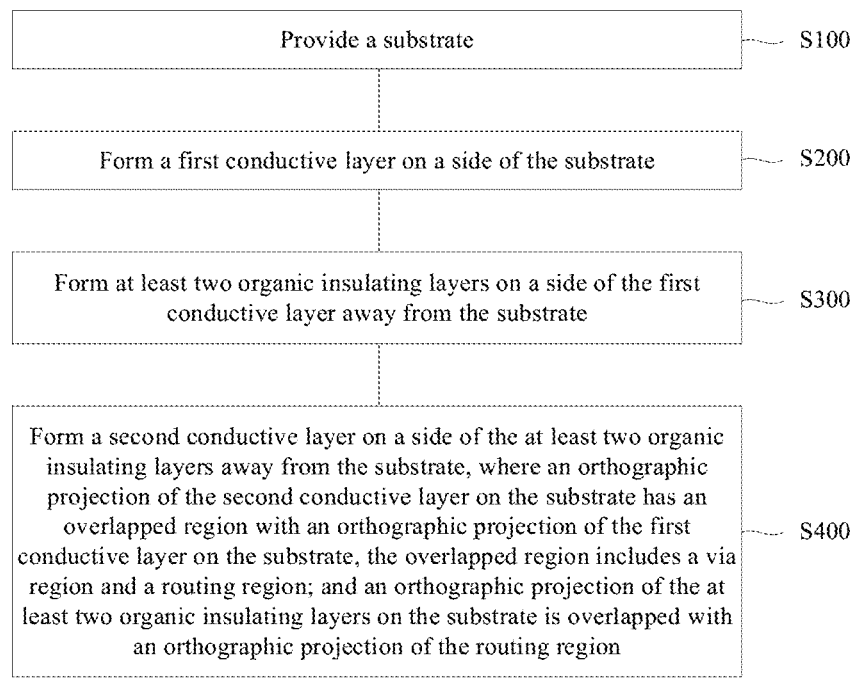
FIG. 2 is a flowchart of a method for manufacturing an array substrate according to some embodiments of the present disclosure.

Some embodiments of the present disclosure also provides a method for manufacturing an array substrate, as shown in FIG. 2, including:

step S100, providing a substrate;

step S200, forming a first conductive layer on a side of the substrate;

step S300, forming at least two organic insulating layers on a side of the first conductive layer away from the substrate; and step S400, forming a second conductive layer on a side of the at least two organic insulating layers away from the substrate, where an orthographic projection of the second conductive layer on the substrate has an overlapped region with an orthographic projection of the first conductive layer on the substrate, the overlapped region includes a via region and a routing region; and an orthographic projection of the at least two organic insulating layers on the substrate is overlapped with an orthographic projection of the routing region.

Each step in the method for manufacturing the array substrate provided by the present disclosure will be described in detail below.

In step S100, the substrate is provided.

Figure 3:
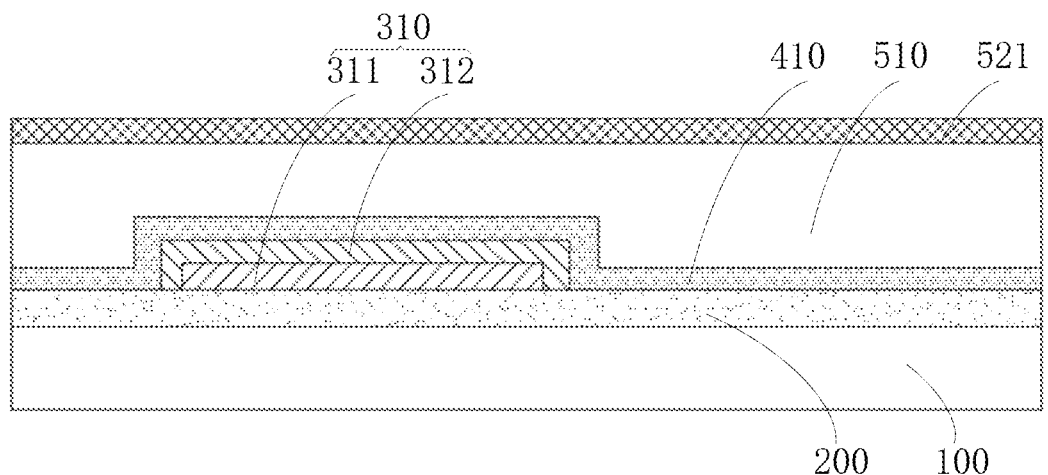
FIG. 3 to FIG. 6 are manufacturing process diagrams of an array substrate according to some embodiments of the present disclosure.
Figure 7:
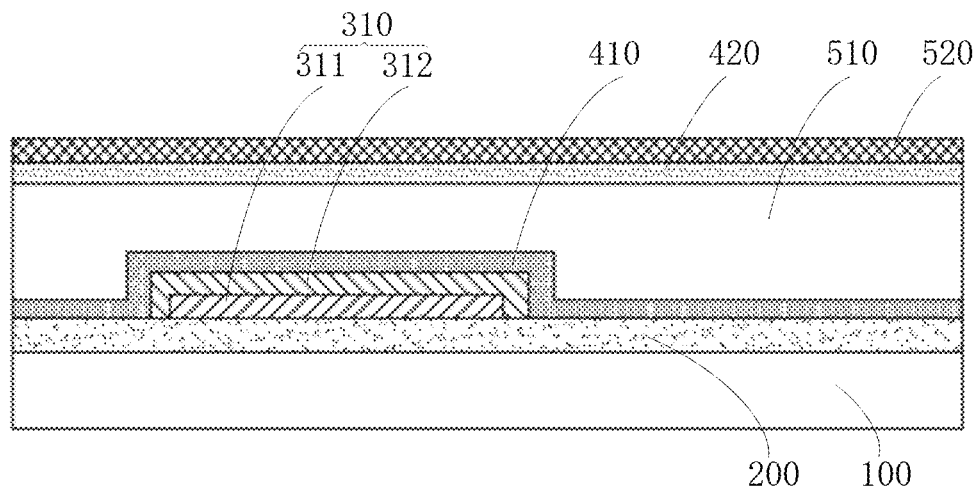
FIG. 7 to FIG. 9 are manufacturing process diagrams of an array substrate according to some embodiments of the present disclosure.

Specifically, as shown in FIG. 3 and FIG. 7, a substrate 100 is provided, and the material of the substrate 100 may be an inorganic material, which may be, for example, a glass material such as soda lime glass, quartz glass, sapphire glass, etc. or various metal materials such as stainless steel, aluminum, nickel or their alloys. In other embodiments, the material of the substrate 100 may also be an organic material. The organic material may be, for example, polymethyl methacrylate, polyvinyl alcohol, polyvinyl phenol, polyethersulfone, polycarbonate, polyethylene terephthalate, polyethylene naphthalate, or a combination thereof. In other embodiments, the material of the substrate 100 may also be a flexible material, such as polyimide.

In step S200, the first conductive layer is formed on a side of the substrate.

Specifically, as shown in FIG. 3 and FIG. 7, a first conductive material layer may be formed on a side of the substrate 100 by sputtering, physical vapor deposition (PVD), chemical vapor deposition (CVD), spin coating or a combination thereof; a first mask 910 is provided, and the first conductive layer 310 is formed by patterning the first conductive material layer through the first mask 910. The first conductive layer 310 includes a plurality of conductive portions including a common voltage line GND, a driving voltage line VLED, a source power line PWR, a source address line DI, and the like. It should be noted that the patterning includes steps such as coating of the photoresist, exposure, development, etching, stripping of the photoresist, and so on.

The material of the first conductive layer 310 includes copper, for example, a laminated material such as MoNb/Cu/MoNb may be formed by sputtering, where a bottom layer MoNb (300 Å) is configured to improve adhesion, an intermediate layer Cu is configured to transmit electrical signals, and a top layer MoNb (200 Å) is used to prevent oxidation. The first conductive layer 310 may be formed by electroplating, where a seed layer MoNiTi is first formed to improve the grain nucleation density, and then an anti-oxidation layer MoNiTi is prepared after electroplating.

In some embodiments of the present disclosure, as shown in FIG. 3, the first conductive layer 310 may be formed of two conductive layers including a first sub conductive layer 311 and a second sub conductive layer 312, and a same process and same material may be adopted for these two conductive layers. The step of forming the first conductive layer 310 on a side of the substrate 100 includes: forming a first sub conductive material layer on a side of the substrate 100; forming a first sub conductive layer 311 by patterning the first sub conductive material layer through the first mask 910; forming a second sub conductive material layer covering the first sub conductive layer 311 on a side of the substrate 100; forming a second sub conductive layer 312 by patterning the second sub conductive material layer through the first mask 910, where the first sub conductive layer 311 and the second sub conductive layer 312 form the first conductive layer 310.

In some embodiments of the present disclosure, as shown in FIG. 3 and FIG. 7, before forming the first conductive layer 310 on a side of the substrate 100, the manufacturing method further includes: forming a buffer layer 200 on the substrate 100 by physical vapor deposition, chemical vapor deposition, spin coating, sputtering or a combination thereof. The material of the buffer layer 200 may be an insulating material such as silicon oxide, silicon nitride and the like, which is not particularly limited herein.

In step S300, at least two organic insulating layers are formed on a side of the first conductive layer away from the substrate.

Figure 4:
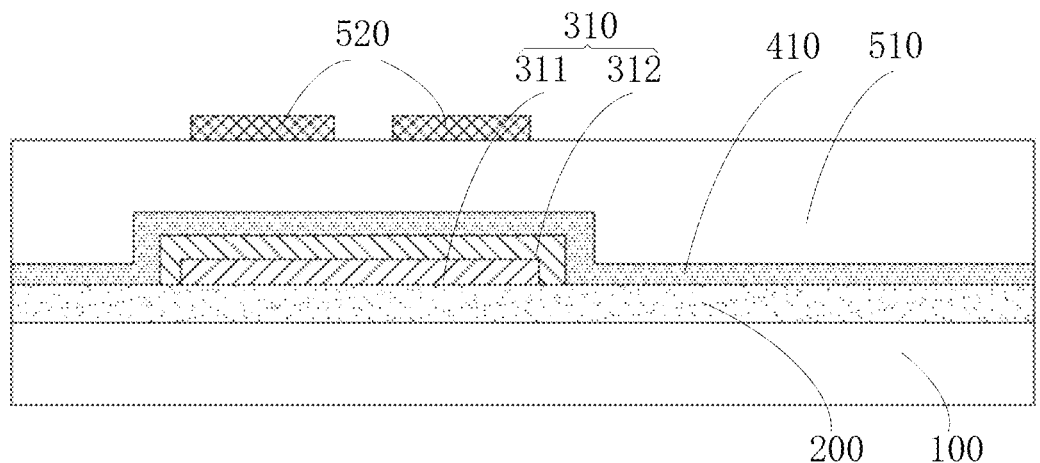
Figure 5:
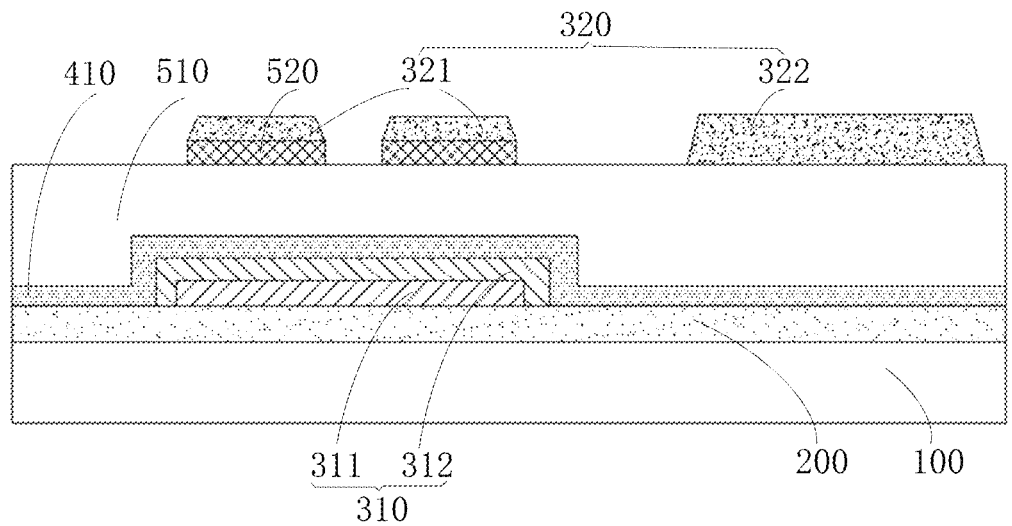

In some embodiments of the present disclosure, as shown in FIG. 4 and FIG. 5, forming the at least two organic insulating layers on the side of the first conductive layer away from the substrate includes: forming a first organic insulating layer 510 on a side of the first conductive layer 310 away from the substrate 100; forming a second organic insulating layer 520 on a side of the first organic insulating layer 510 away from the substrate 100, where an orthographic projection of the second organic insulating layer 520 on the substrate is located within an orthographic projection of an overlapped region of a subsequently formed second conductive layer 320 and the first conductive layer 310.

Specifically, as shown in FIG. 3, the first organic insulating layer 510 may be formed on the side of the first conductive layer 310 away from the substrate 100 by physical vapor deposition, chemical vapor deposition, spin coating or a combination thereof, and the first organic insulating layer 510 may be a structure provided as a whole layer. The first organic insulating layer 510 is only opened with small holes in the bonding region and at the lap joint of the first conductive layer 310 and the second conductive layer 320. Then, a second organic insulating material layer 521 may be formed on the side of the first organic insulating layer 510 away from the substrate 100 by physical vapor deposition, chemical vapor deposition, spin coating, or a combination thereof, and then an insulating transition layer is formed by patterning the second organic insulating material layer 521 through the first mask. Subsequently, as shown in FIG. 4, a second organic insulating layer 520 is formed by patterning the insulating transition layer through a second mask. The first mask is a mask for forming the first conductive layer 310, and the second mask is a mask for forming the second conductive layer 320, therefore the second organic insulating layer 520 is only formed in the overlapped region of the first conductive layer 310 and the second conductive layer 320. The preparation of the second organic insulating layer 520 adopts the mask for the two conductive layers without using a new mask, thereby reducing the production cost.

The materials of the first organic insulating layer 510 and the second organic insulating layer 520 may be OC glue or other suitable organic insulating substances. The materials of the second organic insulating layer 520 and the first organic insulating layer 510 may be the same, for example, both are formed by OC glue. The OC glue may be a negative OC glue.

In some embodiments of the present disclosure, forming the at least two organic insulating layers on the side of the first conductive layer away from the substrate includes: forming a first organic insulating layer on a side of the first conductive layer away from the substrate; and forming a second organic insulating layer provided as a whole layer on a side of the first organic insulating layer away from the substrate.

Specifically, as shown in FIG. 7, the first organic insulating layer 510 may be formed on the side of the first conductive layer 310 away from the substrate 100 by physical vapor deposition, chemical vapor deposition, spin coating or a combination thereof, and the first organic insulating layer 510 may be a structure provided as a whole layer. The first organic insulating layer 510 is opened with small holes only at in the bonding region and the lap joint of the first conductive layer 310 and a subsequently formed second conductive layer 320. Then, a second organic insulating layer 520 may be formed on the side of the first organic insulating layer 510 away from the substrate 100 by physical vapor deposition method, chemical vapor deposition method, spin coating method or a combination thereof, and the second organic insulating layer 520 is a structure provided as a whole layer, and is opened with small holes only in the bonding region and at the lap joint of the first conductive layer 310 and the second conductive layer 320. The negative OC glue may be used when forming the second organic insulating layer 520, and the second organic insulating layer 520 which does not cover the bonding region is formed by pushing a baffle over the bonding region for shielding, which realizes the dual effects of thickening the organic insulating layer and thinning the bonding region by adopting one mask.

In some embodiments of the present disclosure, after forming the first conductive layer and before forming the second conductive layer, the manufacturing method further includes: forming at least two inorganic insulating layers on the side of the first conductive layer away from the substrate, where the at least two inorganic insulating layers and the at least two organic insulating layers are arranged in an overlapped manner.

Specifically, as shown in FIG. 7, after forming the first conductive layer 310 on a side of the substrate 100, and before forming the first organic insulating layer 510 on the side of the first conductive layer 310 away from the substrate 100, the manufacturing method further includes: forming a first inorganic insulating material layer on a side of the first conductive layer 310 away from the substrate 100 by sputtering, physical vapor deposition, chemical vapor deposition, spin coating, or a combination thereof, and forming a first organic insulating layer 510 on a side of the first organic material layer away from the first conductive layer 310; forming a patterned first inorganic insulating layer 410 by patterning the first inorganic material layer with the patterned first organic insulating layer 510 serving as a mask. The material of the first inorganic insulating layer 410 may be silicon oxide, silicon oxynitride, silicon nitride, or other suitable insulating substances (for example, organic polymer compound) or a combination of the above materials.

As shown in FIG. 7, a second inorganic insulating layer 420 may also be formed between the first organic insulating layer 510 and the second organic insulating layer 520. The second inorganic insulating material layer may be formed on a side of the first organic insulating layer 510 away from the substrate 100 by sputtering, physical vapor deposition, chemical vapor deposition, spin coating, or a combination thereof, the second organic insulating layer 520 may be formed on a side of the second inorganic insulating material layer away from the substrate 100, and the second inorganic insulating layer 420 may be formed by patterning the second inorganic insulating material layer with the second organic insulating layer 520 serving as a mask. The preparation of the first inorganic insulating layer 410 and the second inorganic insulating layer 420 does not require an additional mask, and the first organic insulating layer 510 and the second organic insulating layer 520 adopt a same mask. In other words, the first organic insulating layer 510, the second organic insulating layer 520, the first inorganic insulating layer 410 and the second inorganic insulating layer 420 only use one mask to achieve the dual effects of thickening the organic insulating layer and thinning the bonding region, and also achieve a desirable insulating "sandwich" structure: the first inorganic insulating layer, the first organic insulating layer, and the second inorganic insulating layer. Such design, on one hand, reduces the electric field strength of electrochemical corrosion by increasing the in-plane thickness of the insulating layer, and on the other hand achieves the structural design of the double-layer water barrier, which destroys the anodic reaction and blocks the movement of ions.

In some embodiments of the present disclosure, the at least two organic insulating layers have different thicknesses. Specifically, the thickness of the first organic insulating layer 510 is less than the thickness of the second organic insulating layer 520. The thickness of the first organic insulating layer 510 may be, for example, 1.5 μm to 2.5 µm, such as 1.5 µm, 1.8 µm, 2.0 µm, 2.2 µm, 2.5 µm, and the like, which are not enumerated in the present disclosure. The thickness of the second organic insulating layer 520 may be, for example, 3.5 µm to 4.5 µm, such as 3.5 µm, 3.8 µm, 4.0 µm, 4.2 µm, 4.5 µm, and the like, which are not enumerated in the present disclosure. For another example, the thickness of the first organic insulating layer 510 may also be less than 1.5 µm or greater than 2.5 µm, and the thickness of the second organic insulating layer 520 may also be less than 3.5 µm or greater than 4.5 µm, which is not limited in the present disclosure, as long as the thickness of the first organic insulating layer 510 is less than the thickness of the second organic insulating layer 520.

In step S400, a second conductive layer is formed on a side of the at least two organic insulating layers away from the substrate, an orthographic projection of the second conductive layer on the substrate has an overlapped region with the orthographic projection of the first conductive layer on the substrate, the overlapped region includes a via region and a routing region; and an orthographic projection of the at least two organic insulating layers on the substrate is overlapped with an orthographic projection of routing region.

Figure 8:
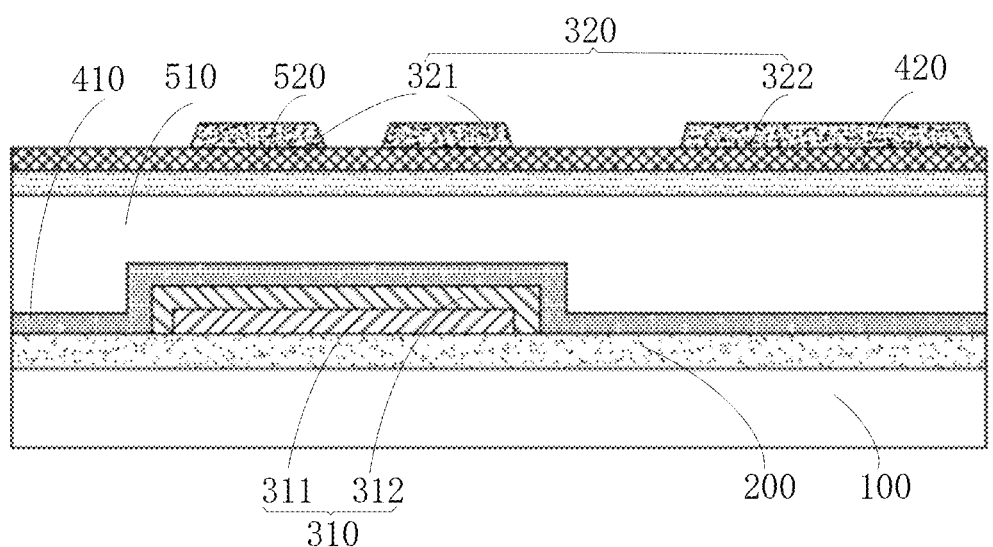

Specifically, as shown in FIG. 5 and FIG. 8, the second conductive material layer may be formed on a side of the second organic insulating layer 520 away from the substrate 100 by physical vapor deposition, chemical vapor deposition, spin coating, sputtering or a combination thereof. Then, a second conductive layer 320 is formed by patterning the second conductive material layer through the second mask.

As shown in FIG. 5, when the orthographic projection of the second organic insulating layer 520 on the substrate 100 is located within the projection of the overlapped region, the second conductive layer 320 includes a first conductive portion 321 corresponding to a pattern of the second organic insulating layer 520. The second conductive layer 320 further includes a second conductive portion 322, and an orthographic projection of the second conductive portion 322 on the substrate 100 is not overlapped with the orthographic projection of the first conductive layer 310 on the substrate 100. As shown in FIG. 6, the first conductive portion 321 of the second conductive layer 320 is provided on the second organic insulating layer 520, and the second conductive portion 322 is provided on the first organic insulating layer 510.

As shown in FIG. 8, when the second organic insulating layer 520 provided as a whole layer is formed on the side of the first organic insulating layer 510 away from the substrate 100, the region of the second conductive layer 320 other than the via is located on the second organic insulating layer 520. The first inorganic insulating layer 410 and the second inorganic insulating layer 420 form a double-layer water barrier, thereby further increasing the distance of the overlapped region of the first conductive layer 310 and the second conductive layer 320, reducing the electric field strength of electrochemical corrosion and blocking the movement of ions.

As shown in FIG. 1, the first conductive layer 310 includes a plurality of conductive portions, including a common voltage line GND, a driving voltage line VLED, a source power line PWR, a source address line DI, and the like. The second conductive layer 320 includes a plurality of pads, and orthographic projections of at least a part of the pads on the substrate 100 are at least partially located within gaps between orthographic projections of the plurality of conductive portions on the substrate 100. In other words, the orthographic projections of at least a part of the pads on the substrate 100 are not overlapped with the orthographic projections of the conductive portions on the substrate 100. By forming the pads in the gaps between the conductive portions, there is no need to provide the second organic insulating layer 520 under the pads, therefore it may avoid the adverse effect of the thickening of the pads caused by providing the second organic insulating layer 520 when the pads are overlapped with the first conductive layer 310.

In some embodiments of the present disclosure, as shown in FIG. 6 and FIG. 9, the manufacturing method further includes: forming a third inorganic insulating layer 430 covering the second conductive layer 320 on the side of the second organic insulating layer 520 away from the second inorganic insulating layer 420 by physical vapor deposition, chemical vapor deposition, spin coating, sputtering or a combination thereof; and forming a third organic insulating layer 530 on a side of the third inorganic insulating layer 430 away from the second organic insulating layer 520.

The material of the third inorganic insulating layer 430 may be silicon oxide, silicon oxynitride, silicon nitride or other suitable insulating material (such as organic polymer compound) or a combination of the above materials. The method for forming the third inorganic insulating layer 410 is, for example, sputtering, physical vapor deposition, chemical vapor deposition, spin coating or a combination thereof. The material of third inorganic insulating layer 430 may be same as or different from that of the first inorganic insulating layer 410 or the second inorganic insulating layer 420.

The material of the third organic insulating layer 530 may be OC glue or other suitable insulating material. The method for forming the third insulating layer 530 is, for example, physical vapor deposition, chemical vapor deposition, a spin coating, or a combination thereof. The material of the third organic insulating layer 530 may be the same as or different from that of the second organic insulating layer 520 or the first organic insulating layer 510, for example, all are formed by OC glue.

It should be noted that although various steps of the method in the present disclosure are described in a specific order in the drawings, it does not require or imply that these steps must be performed in that specific order, or that all the steps shown must be performed to achieve the desired result. Additionally or alternatively, some steps may be omitted, multiple steps may be combined into one step to perform, and/or one step may be decomposed into multiple steps to perform, etc.

The array substrate of the present disclosure may be used as a substrate with a light-emitting function by bonding a light-emitting device, and may be also applied to a display device as a backlight unit.

Some embodiments of the present disclosure further provides a display device which includes the array substrate in the above-mentioned embodiment. Since the display device includes the above-mentioned array substrate, it has the same beneficial effects, and the details are not elaborated in the present disclosure.

The present disclosure does not specifically limit the application of the display device, which may be any product or component with a display function such as TV, notebook computer tablet computer, wearable display device, mobile phone, vehicle-mounted display, navigation, e-book, digital photo frame, advertising light box, and the like.

Those skilled in the art will easily think of other embodiments of the present disclosure, upon consideration of the specification and practicing the content disclosed herein. The present disclosure is intended to cover any variation, use, or adaptive change of the present disclosure which follows the general principles of the present disclosure and includes common general knowledge or commonly used means in the technical field that is not disclosed in the present disclosure. The specification and embodiments are to be regarded as exemplary only, and the true scope and spirit of the present disclosure are indicated by the appended claims.

What is claimed is:

1. An array substrate, comprising:
a substrate;
a first conductive layer, provided on a side of the substrate;
a second conductive layer, provided on a side of the first conductive layer away from the substrate, wherein an orthographic projection of the second conductive layer on the substrate has an overlapped region with an orthographic projection of the first conductive layer on the substrate, and the overlapped region comprises a via region and a routing region; and
at least two organic insulating layers, provided between the first conductive layer and the second conductive layer, and an orthographic projection of the at least two organic insulating layers on the substrate is overlapped with an orthographic projection of the routing region;
wherein the first conductive layer comprises a plurality of conductive portions, the second conductive layer comprises a plurality of pads, and an orthographic projection of at least a part of the pads on the substrate is not overlapped with an orthographic projection of the conductive portions on the substrate.

2. The array substrate according to claim 1, wherein the at least two organic insulating layers comprise:
a first organic insulating layer, provided on the side of the first conductive layer away from the substrate; and
a second organic insulating layer, provided on a side of the first organic insulating layer away from the substrate, wherein an orthographic projection of the second organic insulating layer on the substrate is located within the orthographic projection of the routing region, or wherein the second organic insulating layer is provided as a whole layer.

3. The array substrate according to claim 2, wherein the orthographic projection of the second organic insulating layer on the substrate is located within an orthographic projection of the first organic insulating layer on the substrate.

4. The array substrate according to claim 2, further comprising:
a first inorganic insulating layer, provided between the first conductive layer and the first organic insulating layer.

5. The array substrate according to claim 2, further comprising:
a second inorganic insulating layer, provided between the first organic insulating layer and the second organic insulating layer.

6. The array substrate according to claim 2, wherein the first conductive layer comprises a bonding portion, an orthographic projection of the bonding portion on the substrate is overlapped with the orthographic projection of the first organic insulating layer on the substrate, and the orthographic projection of the bonding portion on the substrate is not overlapped with the orthographic projection of the second organic insulating layer on the substrate.

7. The array substrate according to claim 6, wherein a thickness of the first organic insulating layer is less than a thickness of the second organic insulating layer.

8. The array substrate according to claim 1, wherein the first conductive layer comprises a bonding portion, and an orthographic projection of the bonding portion on the substrate is overlapped with an orthographic projection of only one of the at least two organic insulating layers on the substrate.

9. The array substrate according to claim 1, wherein the at least two organic insulating layers have different thicknesses.

10. A method for manufacturing an array substrate, comprising:
provide a substrate;
forming a first conductive layer on a side of the substrate;
forming at least two organic insulating layers on a side of the first conductive layer away from the substrate; and
forming a second conductive layer on a side of the at least two organic insulating layers away from the substrate, wherein an orthographic projection of the second conductive layer on the substrate has a overlapped region with an orthographic projection of the first conductive layer on the substrate, the overlapped region comprises a via region and a routing region; and an orthographic projection of the at least two organic insulating layers on the substrate is overlapped with an orthographic projection of the routing region;
wherein the first conductive layer comprises a plurality of conductive portions, the second conductive layer comprises a plurality of pads, and an orthographic projection of at least a part of the pads on the substrate is not overlapped with an orthographic projection of the conductive portions on the substrate.

11. The manufacturing method according to claim 10, wherein forming the at least two organic insulating layers on the side of the first conductive layer away from the substrate comprises:
forming a first organic insulating layer on the side of the first conductive layer away from the substrate;
forming a second organic insulating material layer on a side of the first organic insulating layer away from the substrate; and
forming a second organic insulating layer by patterning the second organic insulating material layer though a first mask used for forming the first conductive layer and a second mask used for forming the second conductive layer.

12. The manufacturing method according to claim 10, wherein forming the at least two organic insulating layers on the side of the first conductive layer away from the substrate comprises:
forming a first organic insulating layer on the side of the first conductive layer away from the substrate; and
forming, on a side of the first organic insulating layer away from the substrate, a second organic insulating layer provided as a whole layer.

13. The manufacturing method according to claim 12, further comprising:
forming a first inorganic insulating material layer on the side of the first conductive layer away from the substrate;
forming a first organic insulating layer on a side of the first inorganic insulating material layer away from the substrate; and forming a first inorganic insulating layer by patterning the first inorganic insulating material layer with the first organic insulating layer serving as a mask.

14. The manufacturing method according to claim 13, further comprising:
forming a second inorganic insulating material layer on the side of the first organic insulating layer away from the substrate;
forming the second organic insulating layer on a side of the second inorganic insulating material layer away from the substrate; and
forming a second inorganic insulating layer by patterning the second inorganic insulating material layer with the second organic insulating layer serving as a mask.

15. The manufacturing method according to claim 12, further comprising:
forming a second inorganic insulating material layer on the side of the first organic insulating layer away from the substrate;
forming the second organic insulating layer on a side of the second inorganic insulating material layer away from the substrate; and
forming a second inorganic insulating layer by patterning the second inorganic insulating material layer with the second organic insulating layer serving as a mask.

16. A display device, comprising an array substrate, wherein the array substrate comprises:
a substrate;
a first conductive layer, provided on a side of the substrate;
a second conductive layer, provided on a side of the first conductive layer away from the substrate, wherein an orthographic projection of the second conductive layer on the substrate has an overlapped region with an orthographic projection of the first conductive layer on the substrate, and the overlapped region comprises a via region and a routing region; and
at least two organic insulating layers, provided between the first conductive layer and the second conductive layer, and an orthographic projection of the at least two organic insulating layers on the substrate is overlapped with an orthographic projection of the routing region;
wherein the first conductive layer comprises a plurality of conductive portions, the second conductive layer comprises a plurality of pads, and an orthographic projection of at least a part of the pads on the substrate is not overlapped with an orthographic projection of the conductive portions on the substrate.

17. The display device according to claim 16, wherein the at least two organic insulating layers comprise:
a first organic insulating layer, provided on the side of the first conductive layer away from the substrate; and
a second organic insulating layer, provided on a side of the first organic insulating layer away from the substrate, wherein an orthographic projection of the second organic insulating layer on the substrate is located within the orthographic projection of the routing region.

18. The display device according to claim 16, wherein the at least two organic insulating layers comprise:
a first organic insulating layer, provided on the side of the first conductive layer away from the substrate; and
a second organic insulating layer, provided on a side of the first organic insulating layer away from the substrate, wherein the second organic insulating layer is provided as a whole layer.

* * * * *